(12) United States Patent
Min et al.

(10) Patent No.: US 10,952,316 B2
(45) Date of Patent: Mar. 16, 2021

(54) PRINTED CIRCUIT BOARD

(71) Applicant: SAMSUNG ELECTRO-MECHANICS CO., LTD., Suwon-si (KR)

(72) Inventors: Tae Hong Min, Suwon-si (KR); Ju Ho Kim, Suwon-si (KR)

(73) Assignee: SAMSUNG ELECTRO-MECHANICS CO., LTD., Suwon-si (KR)

( * ) Notice: Subject to any disclaimer, the term of this patent is extended or adjusted under 35 U.S.C. 154(b) by 0 days.

(21) Appl. No.: 16/679,736

(22) Filed: Nov. 11, 2019

(65) Prior Publication Data
US 2021/0014964 A1 Jan. 14, 2021

(30) Foreign Application Priority Data
Jul. 8, 2019 (KR) .................. 10-2019-0082246

(51) Int. Cl.
H05K 1/02 (2006.01)
H05K 3/00 (2006.01)
H05K 1/03 (2006.01)

(52) U.S. Cl.
CPC .......... *H05K 1/0281* (2013.01); *H05K 1/023* (2013.01); *H05K 1/0278* (2013.01); *H05K 3/007* (2013.01); *H05K 1/036* (2013.01); *H05K 2201/0141* (2013.01)

(58) Field of Classification Search
CPC .................................................. H05K 1/0221
See application file for complete search history.

(56) References Cited

U.S. PATENT DOCUMENTS

| | | | |
|---|---|---|---|
| 2008/0087455 A1* | 4/2008 | Hu ....................... | H05K 1/0221 174/120 R |
| 2011/0123772 A1 | 5/2011 | Lee et al. | |
| 2014/0299374 A1* | 10/2014 | Kato ..................... | H05K 1/0221 174/75 C |
| 2015/0331447 A1* | 11/2015 | Hasegawa ............ | H05K 1/0281 361/679.03 |
| 2018/0042107 A1* | 2/2018 | Yosui ..................... | H05K 1/183 |

FOREIGN PATENT DOCUMENTS

| | | |
|---|---|---|
| KR | 10-1092587 B1 | 12/2011 |
| KR | 10-2018-0060695 A | 6/2018 |

* cited by examiner

*Primary Examiner* — Hung V Ngo

(74) *Attorney, Agent, or Firm* — Morgan, Lewis & Bockius LLP

(57) ABSTRACT

A printed circuit board is disclosed. The printed circuit board includes a first substrate portion, and a second substrate portion connected to the first substrate portion and having a flexible insulation layer which is bendable, and the second substrate portion includes a frame member inserted into the flexible insulation layer.

16 Claims, 5 Drawing Sheets

PRINTED CIRCUIT BOARD

CROSS-REFERENCE TO RELATED APPLICATION(S)

This application claims the benefit of priority to Korean Patent Application No. 10-2019-0082246 filed on Jul. 8, 2019 in the Korean Intellectual Property Office, the disclosure of which is incorporated herein by reference in its entirety.

TECHNICAL FIELD

The present disclosure relates to a printed circuit board.

BACKGROUND

Recently, with the development of ultra-high definition displays and antenna modules for high frequency transmission, demand for a printed circuit board having a rigid-flex structure is increasing.

Meanwhile, in order to apply a printed circuit board having a rigid-flex structure to a device with high performance, a high degree of circuit density is required in a confined space, so demand for a technology for mounting an electronic device or implementing a fine circuit in a flexible substrate portion is increasing.

SUMMARY

An aspect of the present disclosure is to provide a printed circuit board including a first substrate portion, and a second substrate portion connected to the first substrate portion and having a flexible insulation layer which is bendable, the second substrate portion including a frame member inserted into the flexible insulation layer.

Other features and aspects will be apparent from the following detailed description, the drawings, and the claims.

BRIEF DESCRIPTION OF DRAWINGS

The above and other aspects, features, and advantages of the present disclosure will be more clearly understood from the following detailed description taken in conjunction with the accompanying drawings, in which.

DETAILED DESCRIPTION

Figure 1:
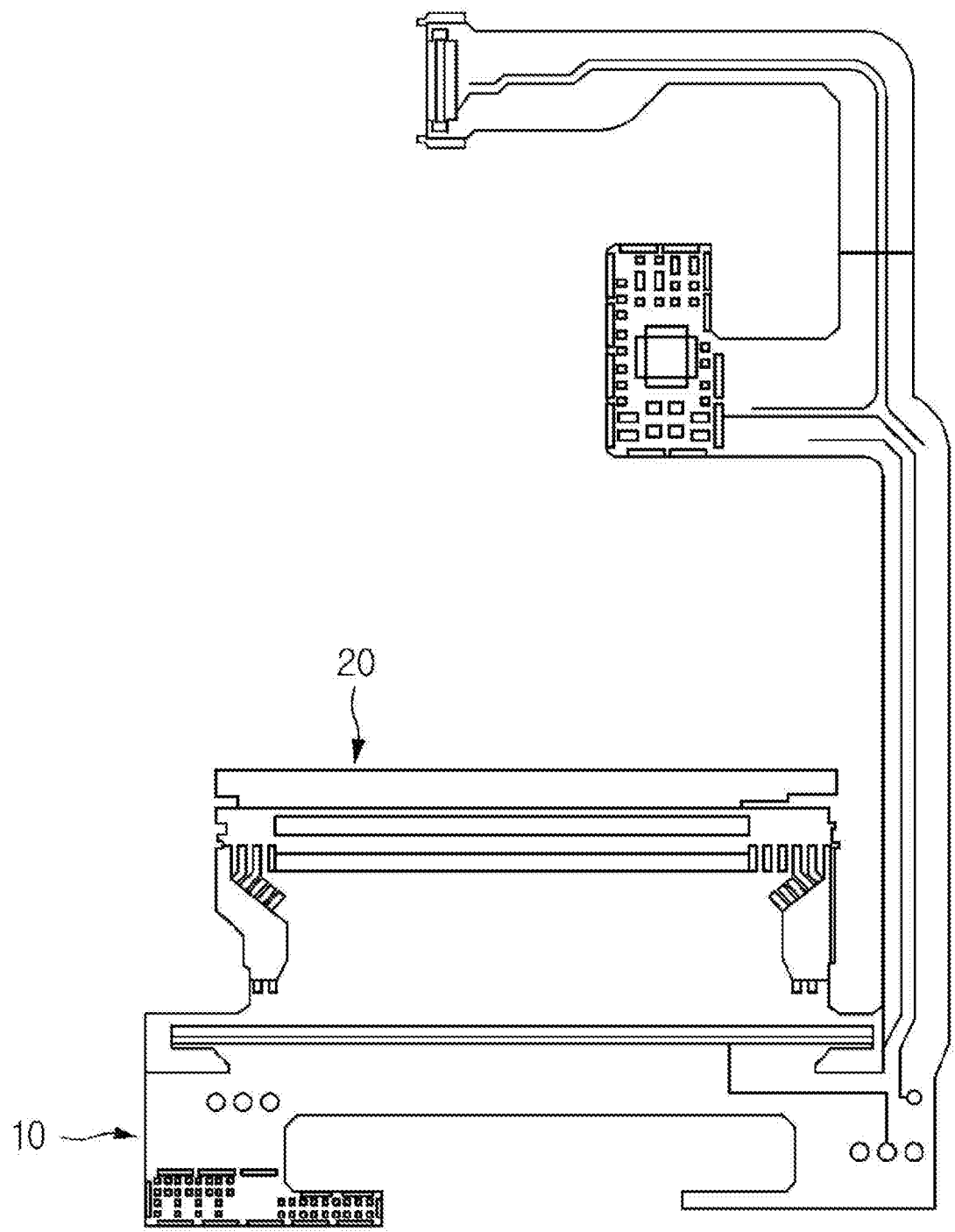
FIG. 1 is a view illustrating a printed circuit board according to an embodiment of the present disclosure.

Hereinafter, embodiments of the present disclosure will be described as follows with reference to the attached drawings.

The present disclosure may, however, be exemplified in many different forms and should not be construed as being limited to the specific embodiments set forth herein. Rather, these embodiments are provided so that this disclosure will be thorough and complete, and will fully convey the scope of the disclosure to those skilled in the art.

Throughout the specification, it will be understood that when an element, such as a layer, region or wafer (substrate), is referred to as being "on," "connected to," or "coupled to" another element, it can be directly "on," "connected to," or "coupled to" the other element or other elements intervening therebetween may be present. In contrast, when an element is referred to as being "directly on," "directly connected to," or "directly coupled to" another element, there may be no elements or layers intervening therebetween. Like numerals refer to like elements throughout. As used herein, the term "and/or" includes any and all combinations of one or more of the associated listed items.

It will be apparent that though the terms first, second, third, etc. may be used herein to describe various members, components, regions, layers and/or sections, these members, components, regions, layers and/or sections should not be limited by these terms. These terms are only used to distinguish one member, component, region, layer or section from another region, layer or section. Thus, a first member, component, region, layer or section discussed below could be termed a second member, component, region, layer or section without departing from the teachings of the exemplary embodiments.

Spatially relative terms, such as "above," "upper," "below," and "lower" and the like, may be used herein for ease of description to describe one element's relationship to another element(s) as shown in the figures. It will be understood that the spatially relative terms are intended to encompass different orientations of the device in use or operations, in addition to the orientation depicted in the figures. For example, if the device in the figures is turned over, elements described as "above," or "upper" other elements would then be oriented "below," or "lower" the other elements or features. Thus, the term "above" can encompass both the above and below orientations depending on a particular direction of the figures. The device may be otherwise oriented (rotated 90 degrees or at other orientations) and the spatially relative descriptors used herein may be interpreted accordingly.

The terminology used herein describes particular embodiments only, and the present disclosure is not limited thereby. As used herein, the singular forms "a," "an," and "the" are intended to include the plural forms as well, unless the context clearly indicates otherwise. It will be further understood that the terms "comprises," and/or "comprising" when used in this specification, specify the presence of stated features, integers, steps, operations, members, elements, and/or groups thereof, but do not preclude the presence or addition of one or more other features, integers, steps, operations, members, elements, and/or groups thereof.

Hereinafter, embodiments of the present disclosure will be described with reference to schematic views illustrating embodiments of the present disclosure. In the drawings, for example, due to manufacturing techniques and/or tolerances, modifications of the shape shown may be estimated. Thus, embodiments of the present disclosure should not be construed as being limited to the particular shapes of regions shown herein, for example, to include a change in shape results in manufacturing. The following embodiments may also be constituted by one or a combination thereof.

The contents of the present disclosure described below may have a variety of configurations and propose only a required configuration herein, but are not limited thereto.

Figure 2:
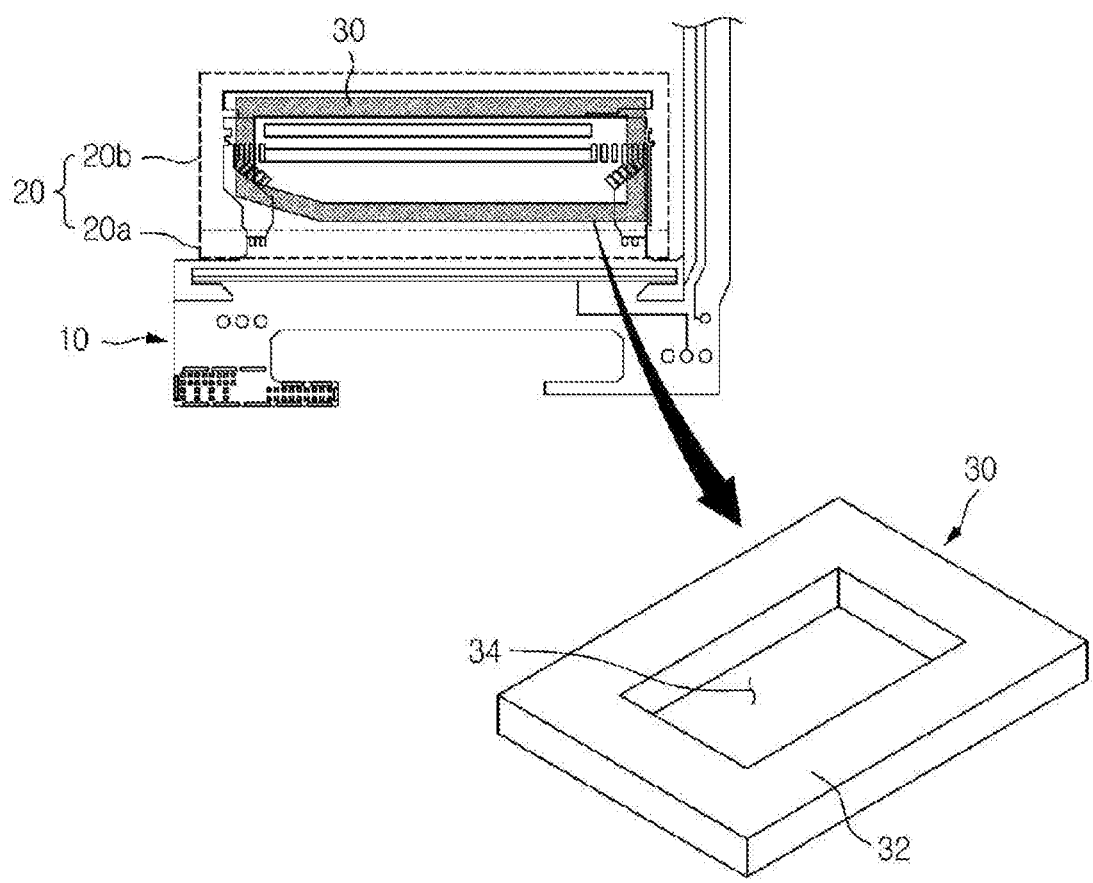
FIGS. 2 and 3 are views illustrating a second substrate portion in a printed circuit board according to an embodiment of the present disclosure.
Figure 3:
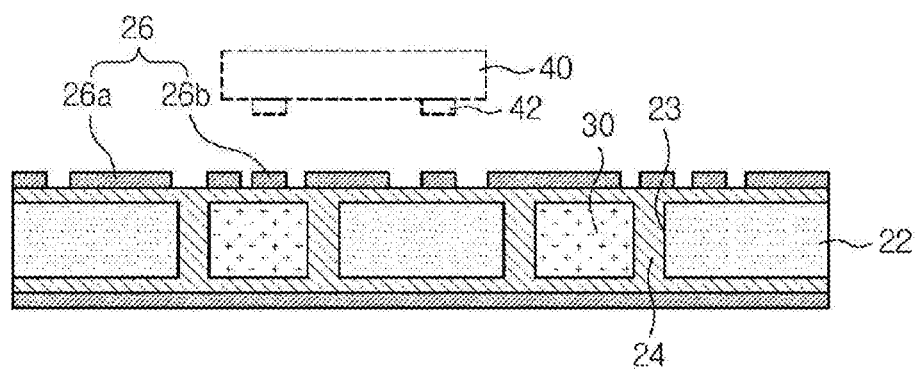

FIG. 1 is a view illustrating a printed circuit board according to an embodiment of the present disclosure. FIGS. 2 and 3 are views illustrating a second substrate portion in a printed circuit board according to an embodiment of the present disclosure.

Referring to FIGS. 1-3, a printed circuit board according to an embodiment of the present disclosure includes a first substrate portion 10 and a second substrate portion 20.

The first substrate portion 10 is a portion to which the second substrate portion 20 is connected. The first substrate portion 10 according to an embodiment may be a rigid substrate not being bent. That is, the first substrate portion may be formed of a material with rigidity higher than that of the second substrate portion 20 having flexible insulation layers 22 and 24.

In addition, a portion of the first substrate portion 10, connected to the second substrate portion 20, is provided as a rigid substrate, but another portion of the first substrate portion 10 may be provided as a flexible substrate.

The second substrate portion 20 is connected to the first substrate portion 10, and has the flexible insulation layers 22 and 24, which are bendable. The printed circuit board according to an embodiment may be provided as a printed circuit board having a rigid-flex structure (a rigid flex PCB), in which the first substrate portion 10 is a rigid substrate, and the second substrate portion 20 is a flexible substrate.

For example, a flexible insulation layer such as a polyimide film is stacked to form a flexible substrate, which is bendable, is formed. Then, a hard insulating layer (a relatively hard insulating layer as compared with an insulation layer which is flexible), such as a circuit pattern and an epoxy, is additionally formed on the flexible substrate. Thus, a hard substrate, formed of a material harder than the flexible substrate, may be provided. Accordingly, a printed circuit board having a rigid-flex structure may be provided, in which a portion in which only a flexible substrate remains is provided as the second substrate portion 20, a bendable flexible substrate, and the remainder is provided as the first substrate portion 10, a hard substrate. Here, 'flexible' and 'hard' refer to the difference in a degree of bending relative to each other. Here, a material having sufficient strength to be bendable, according to the intention of the user, is referred to as a flexible material, while a material not being bent is referred to as a hard material.

In detail, the second substrate portion 20 according to an embodiment may include a frame member 30 inserted into the flexible insulation layers 22 and 24. The frame member 30 may be inserted into a portion of the flexible insulation layers 22 and 24, in which bending is not required, thereby increasing strength and suppressing deformation (expansion or contraction) caused by heat. Accordingly, due to increased dimensional stability of the flexible insulation layers 22 and 24, into which the frame member 30 is inserted, a precise circuit pattern may be formed or an electronic element may be mounted on the second substrate portion 20. The frame member 30 may include a metal with a low coefficient of thermal expansion, a ceramic, or an alloy such as invar or covar, in order to increase strength of the second substrate portion 20 and prevent thermal deformation.

Referring to FIG. 2, a second substrate portion 20 according to an embodiment may include a first region 20a, disposed adjacent to the first substrate portion 10 and connected to the first substrate portion 10, and which is bendable, and a second region 20b spaced apart from the first substrate portion 10 and into which a frame member 30 is inserted. That is, the second substrate portion 20, formed of the flexible insulation layers 22 and 24, may be divided into a first region 20a, into which a frame member 30 is not inserted, and a second region 20b (including an inner region of the frame member 30), into which the frame member 30 is inserted. In this case, the first region 20a, a bendable portion, is a portion connected to the first substrate portion 10. Accordingly, when bending of the second substrate portion 20 with respect to the first substrate portion 10 is required, the first region 20a of the second substrate portion 20 may be bent or folded.

The frame member 30 according to an embodiment may have a form in which bars 32 in a straight or curved form are connected to each other. For example, the frame member is formed to have a form similar to a boundary of the second region 20b, and thus may be inserted thereinto along a perimeter of the second region 20b. In this case, an interior of the frame member 30 is penetrated, so an empty space 34 or a recess (not shown) may be provided. A via of the second substrate portion 20 may be disposed in the empty space 34 of the frame member 30.

Meanwhile, the empty space 34 is formed in an inner region of the frame member 30, and the flexible insulation layers 22 and 24, disposed in the empty space 34 of the frame member 30, are also locked by the frame member 30. Thus, expansion and contraction, caused by heat, are suppressed, so dimensional stability may be secured.

Referring to FIG. 3, a circuit pattern 26 may be formed one surface of the flexible insulation layers 22 and 24. In this case, the circuit pattern 26 includes a pad 26b on which the first electronic element 40 is mounted, and the pad 26b may be formed on the second region 20b. The pad 26b, on which the first electronic element 40 is mounted, may require high dimensional stability for reliable connection. Accordingly, the pad 26b is preferably formed in the second region 20b (including an inner region of the frame member 30), into which the frame member 30 is inserted. As compared with a circuit pattern 26a formed in an outer region of the frame member 30, the pad 26b may have low thermal deformation and high strength.

Moreover, in an embodiment, it is presented that the frame member 30 with a closed curve structure has a structure in which an internal space is closed by side surfaces, but an embodiment is not limited thereto. Alternatively, the frame member may have a structure in which a side surface of the frame member 30 is partially open.

Moreover, a primer or metal particles may be applied to a surface of the frame member 30 inserted into the flexible insulation layers 22 and 24. The primer or metal particles such as copper may increase a binding force between the flexible insulation layers 22 and 24 and the frame member 30.

Moreover, the flexible insulation layers 22 and 24 according to an embodiment may have a composite structure formed of the first insulation material 22 and the second insulation material 24.

Referring to FIG. 3, a through-hole 23, into which the frame member 30 is inserted, may be formed in the first insulation material 22. The second insulation material 24 may have a structure embedding the first insulation material 22 and the frame member 30. The first insulation material 22 forms a main portion of the flexible insulation layers 22 and 24, and the second insulation material 24 may allow the frame member 30, disposed in the through-hole 23 of the first insulation material 22, to be coupled to the first insulation material 22. In this case, in order to easily perform filling between the first insulation material 22 and the frame member 30, the second insulation material 24 may be formed of a material having flowability higher than that of the first insulation material 22.

In this case, the first insulation material 22 may include polyimide or a liquid crystal polymer (LCP). In detail, the liquid crystal polymer (LCP) has a coefficient of thermal expansion similar to that of copper, so less deformation occurs during processing. Moreover, the LCP has dimensional stability higher than that of other materials. In addition, the LCP has low dielectric permittivity and low dielectric loss, so it is advantageous for high speed signal transmission.

Figure 4:
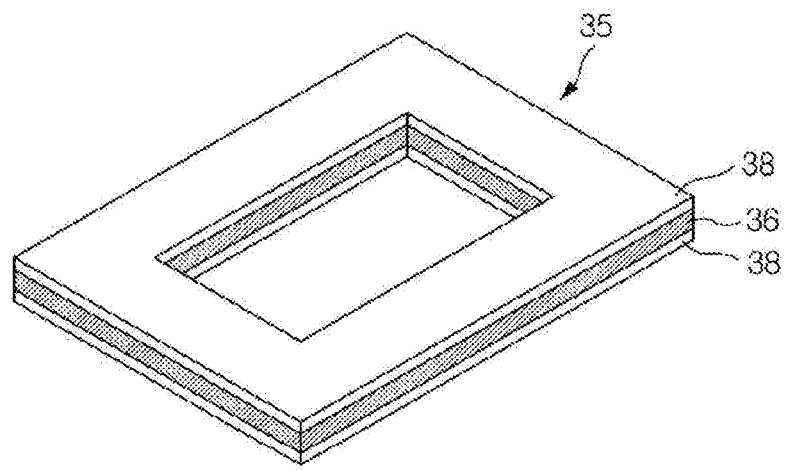
FIG. 4 is a view illustrating another example of a frame member of a printed circuit board according to an embodiment of the present disclosure.

FIG. 4 is a view illustrating another example of a frame member of a printed circuit board according to an embodiment of the present disclosure.

Referring to FIG. 4, a frame member 35 may have a plurality of layers. For example, a copper layer 38 is stacked on each of both sides of an alloy layer 36 such as invar or covar having a low coefficient of thermal expansion to form the frame member 35.

Figure 5:
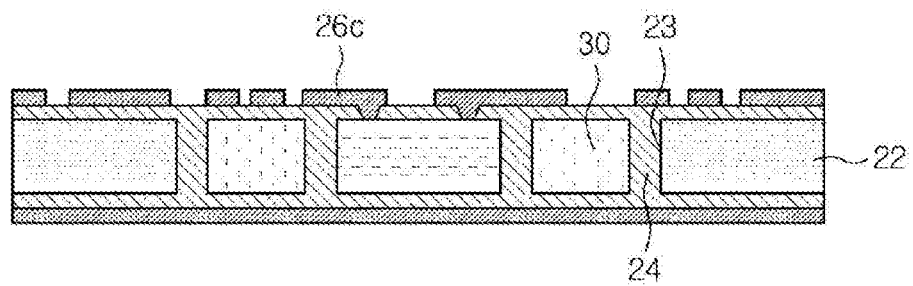
FIGS. 5 and 6 are views illustrating a second substrate portion in a printed circuit board according to another embodiment of the present disclosure.
Figure 6:
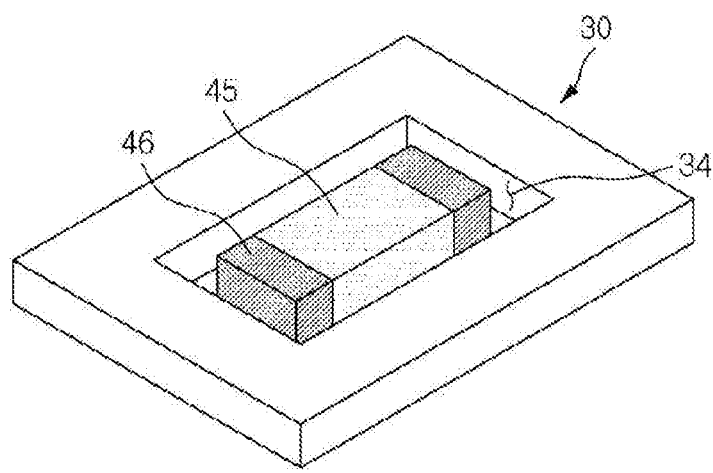

FIGS. 5 and 6 are views illustrating a second substrate portion in a printed circuit board according to another embodiment of the present disclosure.

Referring to FIGS. 5 and 6, an accommodation space 34, which is penetrated, is formed in a frame member 30 according to an embodiment, and a second electronic element 45 is disposed in the accommodation space 34 to be embedded in flexible insulation layers 22 and 24.

In this case, the frame member 30 may include an electro magnetic interference (EMI) shielding material. For example, the frame member 30 may be at least one of a magnetic material and a metal.

Moreover, a circuit pattern 26, formed on one side of the flexible insulation layers 22 and 24, may be electrically connected to the second electronic element 45. For example, a portion 26c of the circuit pattern 26 may be connected to an electrode 46 of the second electronic element 45 through a via.

Moreover, the accommodation space 34 of the frame member 30 is covered by a metal layer formed on the flexible insulation layers 22 and 24, so an EMI shielding effect may be improved.

FIGS. 7 to 11 are views illustrating a method of manufacturing a second substrate portion in a printed circuit board according to an embodiment of the present disclosure.

Figure 7:
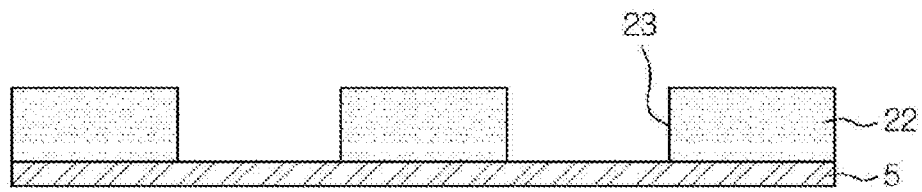
FIGS. 7 to 11 are views illustrating a method of manufacturing a second substrate portion in a printed circuit board according to an embodiment of the present disclosure.

Referring to FIG. 7, a first insulation material 22 having a through-hole 23 may be stacked on a carrier 5. In this case, the through-hole 23 is formed in the first insulation material 22, and then the first insulation material 22 may be attached to the carrier 5.

Figure 8:
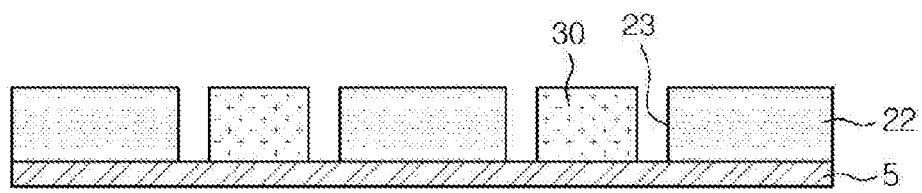

Referring to FIG. 8, a frame member 30 is disposed to be inserted into the through-hole 23 of the first insulation material 22. In this case, the frame member 30 may be attached to or supported by the carrier 5.

Figure 9:
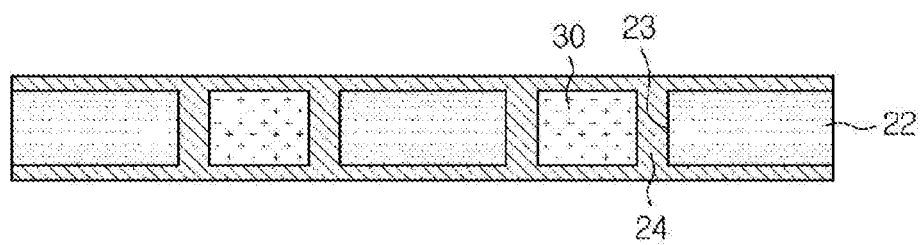

Referring to FIG. 9, the through-hole 23 of the first insulation material 22 is filled with the second insulation material 24, so the frame member 30 and the first insulation material 22 may be coupled to each other. In this case, in order to easily perform filling between the first insulation material 22 and the frame member 30, the second insulation material 24 may be formed of a material having flowability higher than that of the first insulation material 22. Moreover, the second insulation material 24 is stacked on each of both sides of the first insulation material 22, so the second insulation material 24 may allow the first insulation material 22 and the frame member 30 to be embedded. Moreover, the second insulation material 24 is stacked on one side of the first insulation material 22, and then the carrier 5 may be removed therefrom.

Figure 10:
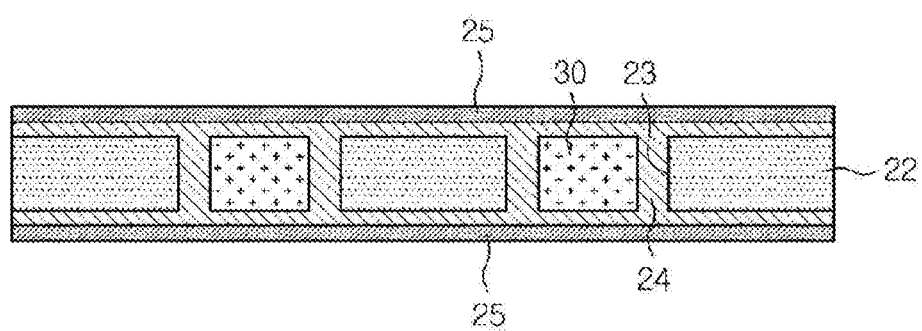
Figure 11:
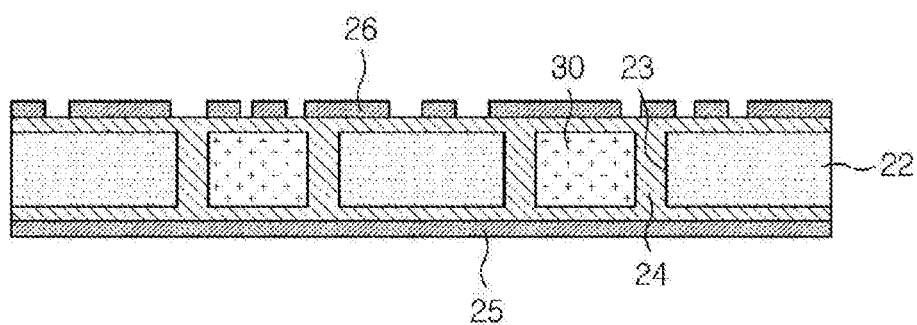

Referring to FIGS. 10 and 11, a metal layer 25 is formed on one side or both sides of the second insulation material 24, and a metal layer 25 is patterned to form a circuit pattern 26.

While exemplary embodiments have been shown and described above, it will be apparent to those skilled in the art that modifications and variations could be made without departing from the scope of the present invention as defined by the appended claims.

What is claimed is:

1. A printed circuit board, comprising:
a first substrate portion; and
a second substrate portion connected to the first substrate portion, and having a flexible insulation layer which is bendable and comprises a first insulation layer having a through-hole therein and a second insulation layer,
wherein the second substrate portion includes a frame member disposed in the through-hole, and
the second insulation layer fills at least a portion of a gap between the frame member and the first insulation layer.

2. The printed circuit board of claim 1, wherein the second substrate portion includes:
a first region, adjacent to the first substrate portion and connected to the first substrate portion, and which is bendable; and
a second region spaced apart from the first substrate portion, and into which the frame member is inserted.

3. The printed circuit board of claim 2, wherein one side of the flexible insulation layer is provided with a pad on which a first electronic element is mounted is formed, and
the pad is formed on the second region.

4. The printed circuit board of claim 1, wherein the frame member is provided with an accommodation space which is penetrated, and
the printed circuit board further includes a second electronic element disposed in the accommodation space, and embedded in the flexible insulation layer.

5. The printed circuit board of claim 4, wherein the frame member includes an electromagnetic interference (EMI) shielding material.

6. The printed circuit board of claim 5, wherein the frame member includes at least one of a magnetic material and a metal.

7. The printed circuit board of claim 1, wherein the flexible insulation layer includes:
a first insulation material having a through-hole into which the frame member is inserted; and
a second insulation material embedding the first insulation material and the frame member therein.

8. The printed circuit board of claim 7, wherein the first insulation material includes a liquid crystal polymer (LCP).

9. The printed circuit board of claim 7, wherein the second insulation material has flowability higher than flowability of the first insulation material.

10. The printed circuit board of claim 1, wherein a surface of the frame member is provided with a primer or metal particles applied thereto.

11. The printed circuit board of claim 1, wherein the frame member has a plurality of layers.

12. A printed circuit board, comprising:
a first substrate portion; and a second substrate portion comprising a bendable flexible insulation layer embedding a frame member and connected to the first substrate portion, wherein the frame member is distinguishable from circuit patterns of the printed circuit board, and wherein the flexible insulation layer comprises a first insulation material surrounding the frame member and a second insulation material embedding the first insulation material and the frame member.

13. The printed circuit board of claim 12, wherein the second substrate portion further comprises a first region contacting the first substrate portion and a second region spaced apart from the first substrate portion, wherein the first region is bendable and the second region encloses the frame member.

14. The printed circuit board of claim 12, wherein the frame member comprises a metal, a magnetic material or a combination thereof.

15. The printed circuit board of claim 12, wherein the frame member includes a recess configured to accommodate an electronic component disposed therein, the electronic component being embedded in flexible insulation layer.

16. A printed circuit board, comprising:

a first substrate portion; and a second substrate portion connected to the first substrate portion, and having a flexible insulation layer which is bendable, wherein the second substrate portion includes a frame member embedded within the flexible insulation layer, wherein the frame member includes a recess configured to accommodate an electronic component disposed therein, the electronic component being embedded in flexible insulation layer, wherein the flexible insulation layer comprises a first insulation material surrounding the frame member and a second insulation material embedding the first insulation material and the frame member.

* * * * *